US008637850B2

(12) United States Patent
Dimitrakopoulos et al.

(10) Patent No.: US 8,637,850 B2
(45) Date of Patent: Jan. 28, 2014

(54) TRANSPORT CONDUITS FOR CONTACTS TO GRAPHENE

(75) Inventors: Christos D. Dimitrakopoulos, Baldwin Place, NY (US); Aaron D. Franklin, Croton on Hudson, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/614,199

(22) Filed: Sep. 13, 2012

(65) Prior Publication Data

US 2013/0334498 A1 Dec. 19, 2013

Related U.S. Application Data

(63) Continuation of application No. 13/524,191, filed on Jun. 15, 2012.

(51) Int. Cl.
*H01L 29/06* (2006.01)
(52) U.S. Cl.
USPC ............................ 257/29; 257/76; 257/192
(58) Field of Classification Search
USPC ................... 257/29, 76, 77, 192, 194, 196
See application file for complete search history.

(56) References Cited

U.S. PATENT DOCUMENTS

| 8,274,098 B2 * | 9/2012 | Chung et al. ................. 257/192 |
| 2010/0051960 A1 * | 3/2010 | Chen et al. ...................... 257/76 |
| 2012/0261643 A1 * | 10/2012 | Cohen et al. ..................... 257/27 |

OTHER PUBLICATIONS

A.D. Franklin et al., "Effects of Nanoscale Contacts to Graphene," IEEE Electron Device Letters, Aug. 2011, pp. 1035-1037, vol. 32, No. 8.
J.A. Robinson et al., "Contacting Graphene," American Institute of Physics Applied Physics Letters 98, 2011, 3 pgs.
C.E. Malec et al., "Vacuum-Annealed Cu Contacts for Graphene Electronics," Solid State Communications 151, 2011, pp. 1791-1793.
Y. Matsuda et al., "Contact Resistance for 'End-Contacted' Metal—Graphene and Metal—Nanotube Interfaces from Quantum Mechanics," J. Phys. Chem. C, 2010, vol. 114, No. 41, pp. 17845-17850.
K. Nagashio et al., "Metal/Graphene Contact as a Performance Killer of Ultra-High Mobility Graphene—Analysis of Intrinsic Mobility and Contact Resistance," IEEE, 2009, pp. 23.2.1-23.2.4.
Y. Sui et al., "Screening and Interlayer Coupling in Multilayer Graphene Field-Effect Transistors," American Chemical Society, Nano Letters, 2009, vol. 9, No. 8, pp. 2973-2977.
S. Russo et al., "Contact Resistance in Graphene-Based Devices," Physica E, vol. 42, Issue 4, pp. 677-679.

* cited by examiner

*Primary Examiner* — Kevin M Picardat
(74) *Attorney, Agent, or Firm* — Louis J. Percello; Ryan, Mason & Lewis, LLP

(57) ABSTRACT

An apparatus comprises at least one transistor. The at least one transistor comprises a substrate, a graphene layer formed on the substrate, and first and second source/drain regions spaced apart relative to one another on the substrate. The graphene layer comprises at least a first portion and a second portion, the first portion being in contact with the first source/drain region and the second portion being in contact with the second source/drain region. One or more cuts are formed in at least one of the first and second portions of the graphene layer. The apparatus allows for lowered contact resistance in graphene/metal contacts.

21 Claims, 3 Drawing Sheets

TRANSPORT CONDUITS FOR CONTACTS TO GRAPHENE

CROSS-REFERENCE TO RELATED APPLICATION

This application is a Continuation of U.S. patent application Ser. No. 13/524,191, filed on Jun. 15, 2012, the disclosure of which is incorporated herein by reference.

FIELD

The field relates to contact resistance and, more particularly, to techniques for lowering contact resistance in graphene devices.

BACKGROUND

Silicon-based nanoelectronic devices such as transistors are approaching upper bounds for performance due to inherent limitations of silicon. As a result, various materials have been proposed as replacements for silicon in nanoelectronic devices. One such material is graphene. Graphene has been shown to have unique properties useful for nanoelectronic applications, such as high carrier mobility.

However, a high contact resistance has been associated with metal/graphene contacts which impacts performance. For example, in graphene field-effect transistors (FETs) with channels that are several μm in length, the high contact resistance associated with the metal/graphene contacts impacts performance. As channel lengths scale to technologically relevant values in the range of hundreds of nanometers or below, high contact resistance of the metal/graphene contacts dominates performance.

SUMMARY

Embodiments of the invention provide techniques for lowering contact resistance in graphene devices.

For example, in one embodiment, an apparatus comprises at least one transistor. The at least one transistor comprises a substrate, a graphene layer formed on the substrate, and first and second source/drain regions spaced apart relative to one another on the substrate. The graphene layer comprises at least a first portion and a second portion, the first portion being in contact with the first source/drain region and the second portion being in contact with the second source/drain region. One or more cuts are formed in at least one of the first and second portions of the graphene layer.

Further embodiments of the invention comprise one or more of the following features.

The one or more cuts are formed parallel to one another.

The graphene layer is cleaned to remove at least a portion of residue formed on the graphene layer as a result of forming the one or more cuts.

At least one of the one or more cuts has a length at least equal to a transfer length of the contact between a given one of the first and second portions of the graphene layer and a given one of the first and second source/drain regions.

The graphene layer is annealed subsequent to the one or more cuts being formed.

The one or more cuts are formed apart relative to one another, such that two or more of the cuts do not merge to form a single cut.

Advantageously, one or more embodiments of the invention allow for lower contact resistance in graphene/metal contacts.

These and other embodiments of the invention will become apparent from the following detailed description of illustrative embodiments thereof, which is to be read in connection with the accompanying drawings.

DETAILED DESCRIPTION

Illustrative embodiments of the invention may be described herein in the context of an illustrative method or device or article etc. However, it is to be understood that embodiments of the invention are not limited to the illustrative devices, articles or methods described but are more broadly applicable to other suitable methods, devices and articles.

Embodiments of the invention provide a controllable means for lowering the contact resistance between graphene and a metal. While embodiments of the invention may be described with reference to FETs using graphene, the invention is not limited solely to use with FETs but is instead more generally applicable to various other interconnects in nanoelectronics and other technologies. For example, graphene layers formed as described herein may be used in various devices where existing alternatives such as silicon-based devices approach upper bounds of inherent performance limitations. In addition, graphene layers as described herein may be used in place of materials such as silicon even where silicon-based devices are not approaching inherent limitations of silicon, as the unique properties of graphene may provide an advantage relative to silicon. The unique properties of graphene include high carrier mobility.

Embodiments of the invention provide a controllable means or method for lowering the contact resistance in devices with a graphene-metal interconnect. Embodiments of the invention lower the contact resistance by an order of magnitude sufficient for graphene to be considered as a viable silicon replacement material or interconnect technology in devices such as nanoelectronics. By forming cuts in graphene in a contact region between the graphene and a metal, contact resistance is advantageously lowered.

Figure 1:
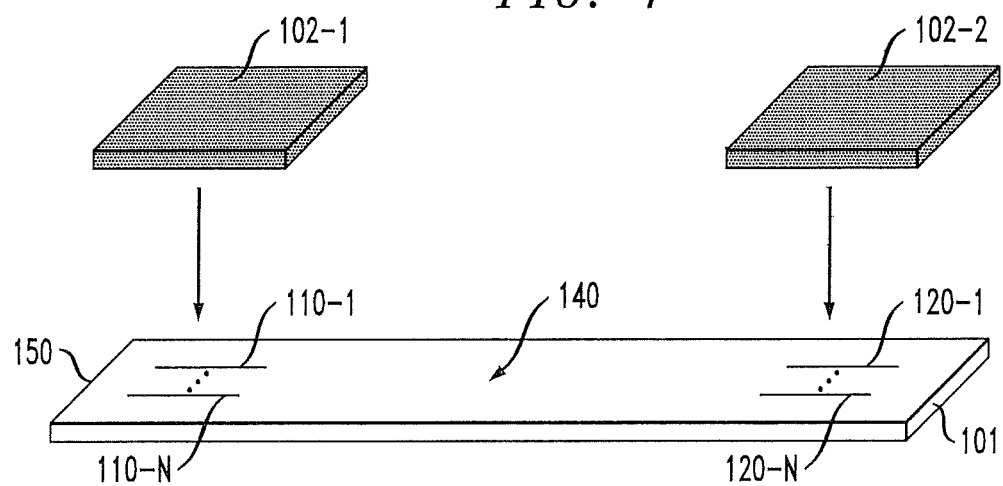
FIG. 1 illustrates metal/graphene contacts, according to an embodiment of the invention.

FIG. 1 illustrates an example of metal/graphene contacts. A graphene layer 101 is shown with sets of cuts 110 and 120 formed on a surface of the graphene layer. While FIG. 1 illustrates two sets of cuts 110 and 120, the invention is not limited solely to arrangements with two sets of cuts, but is instead more generally applicable to arrangements with only one cut or set of cuts or with more than two sets of cuts. The term "cut" as used herein refers to a region where unsatisfied carbon bonds are present. Existing carbon bonds in the graphene are severed in this region so as to create the unsatisfied carbon bonds. The term "graphene layer" as used herein refers to one or more graphene sheets. Thus, a graphene layer may consist of a single sheet of graphene or multiple sheets of graphene.

Metals 102-1 and 102-2 are also shown in FIG. 1. The metals may be a single element or a metal alloy. For example, the metal may be copper (Cu), titanium (Ti), nickel (Ni), palladium (Pd), gold (Au) or a titanium alloy such as Ti/Pd/Au, etc. One skilled in the art will readily recognize that these examples comprise a non-exhaustive list of possible metals, and that the invention is not limited solely to use with the metals and alloys listed above.

As shown in FIG. 1, metals 102-1 and 102-2 form first and second contacts with the graphene layer 101. The first metal 102-1 forms a contact region over cuts 110-1 to 110-N. The number of cuts in a given set (i.e., N) may vary, as described below. The second metal 102-2 forms a second contact region over cuts 120-1 to 120-N. The cuts 110 and 120 formed in the graphene layer 101 amplify transmission of carriers from the metals 102 into the graphene layer 101 and from the graphene layer 101 into metals 102. FIG. 1 illustrates what may be referred to as a "side-contacted" approach, where metals 102 contact with surface 140 of the graphene layer 101.

A theoretical approach referred to as an "edge-contacted" approach has been proposed where metals are connected to an edge 150 of a graphene layer 101. See Y. Matsuda et al., "Contact Resistance for 'End-Contacted' Metal-Graphene and Metal-Nanotube Interfaces from Quantum Mechanics," J. Phys. Chem. C, 114, 17845 (2010). An edge-contacted approach, however, may be difficult to realize in practice. In contrast, the side-contacted approach used in embodiments of the invention is easier and less costly to implement.

Another approach for improvement of contact resistance is to use low power $O_2$ plasma and heat treatment on graphene. See J. Robinson et al., "Contacting Graphene," Appl. Phys. Lett., 98, 053103 (2011). This approach, however, does not provide a reproducible path for establishing good contacts to graphene, which yields an order of magnitude variation in the contact resistance of devices produced using this approach.

Figure 2:
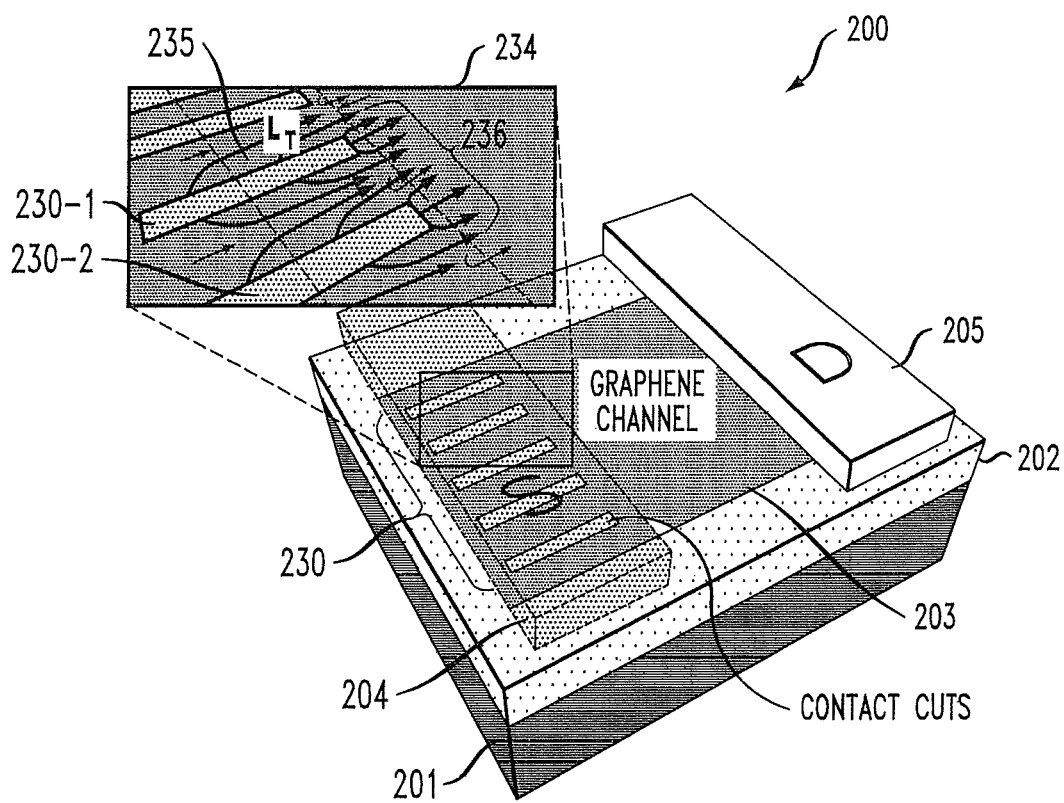
FIG. 2 illustrates a field-effect transistor, according to an embodiment of the invention.

FIG. 2 shows an example of a back-gated FET 200. FET 200 has an oxide 202 formed on a heavily doped substrate (gate) 201. A graphene layer 203 is transferred onto the oxide 202. A set of cuts 230 are formed in a region of the graphene layer 203, the region being defined by a contact area between source 204 and graphene layer 203. A drain 205 is also connected to the graphene layer 203. While not explicitly shown in FIG. 2 for clarity purposes, one or more cuts may also be formed in a region of the graphene layer 203 defined by a contact area between drain 205 and graphene layer 203. An exploded view 234 of FIG. 2 shows a portion of the contact area between source 204 and graphene layer 203. The exploded view 234 shows two cuts, 230-1 and 230-2 of the set of cuts 230. A set of lines 236 illustrates the increased flow of carriers in graphene layer 203 resulting from cuts 230-1 and 230-2. Exploded view 235 also illustrates a transfer length, $L_T$, which will be described in detail below.

In certain embodiments of the invention shown in FIGS. 1 and 2, sets of cuts 110, 120 and 230 are shown with cuts parallel to one another and perpendicular to the interface between the graphene layer 101/203 and metals 102-1/102-2 and/or source 204. The invention is not limited solely to this arrangement, but is instead more generally applicable to arrangements in which some subset of a set of cuts are parallel to one another, where subsets of a set of cuts are angled relative to one another, etc. as may be desired or required for certain interconnect technologies. In addition, the sets of cuts need not be perpendicular to the graphene/metal interface.

Embodiments of the invention enable a strong and stable bond to be formed between a contact metal and graphene at the cut edges to minimize contact resistance and promote a maximum carrier transmission into the graphene channel.

This allows for the perimeter of the end-contacted approach to be increased dramatically in a controllable fashion for reproducibility of low resistance contacts to graphene devices. In addition, once carriers are injected into the graphene they will not be subject to increased scattering events as may be the case for defective graphene contacts formed with low power $O_2$ plasma but rather will be directed along the paths shown in the set of lines 236 shown in the exploded view 234 of FIG. 2.

In some embodiments of the invention, the cuts formed in the graphene layer have a length at least equal to a transfer length, $L_T$. FIG. 2 illustrates $L_T$ 235. $L_T$ is defined as the length over which the potential falls to 1/e of the applied voltage from the contact edge. In some embodiments, such as the example FET 200 shown in FIG. 2, the length of cuts 230-1 and 230-2 exceed $L_T$ 235 which can provide further benefits for carrier transmission.

As described above, the cuts made in the contact regions of the graphene layer result in unsatisfied carbon bonds along the cut edges. The interaction energy between the metal of carbon atoms is greatly increased in these areas. A mechanically stable bond can be formed in these areas, allowing both the carbon pit and pa orbitals to be involved in carrier injection into the graphene.

Sets of cuts such as those shown in FIGS. 1 and 2 may be formed using a variety of techniques. One such technique is electron beam (e-beam) lithography. E-beam lithography may be used to pattern the cuts in the contact regions prior to contact metal deposition. E-beam lithography tools are capable of producing thin cuts less than 100 nm wide, with some tools being capable of producing cuts only 6 nm wide. Thin cuts are desired so as to minimize excessive removal of the contacted graphene while maximizing the cut edge perimeters in the contact area. E-beam lithography is capable of producing cuts with an alignment accuracy of roughly 20 nm. Precise alignment accuracy is desired so as to ensure that a cut is as close as possible to the contact edge and has a length almost equal to or exceeding $L_T$. Additional steps, such as low-temperature annealing treatments, consideration of different contact metals, etc. can further decrease the contact resistance. Other methods of forming the cuts include, but are not limited to, milling with a focused-ion beam (FIB) and nanoimprint lithography.

Figure 3A:
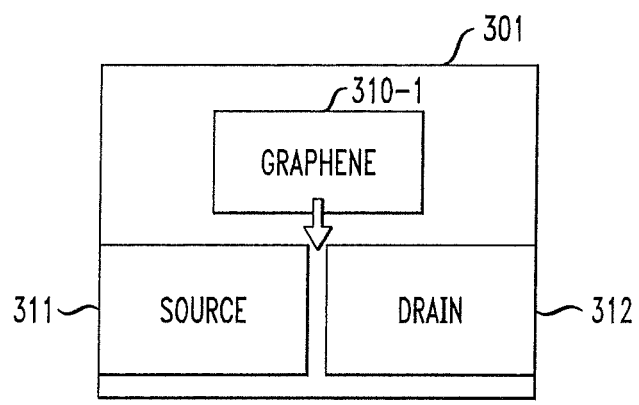
FIGS. 3A-3C illustrate graphene layers, according to an embodiment of the invention.
Figure 3B:
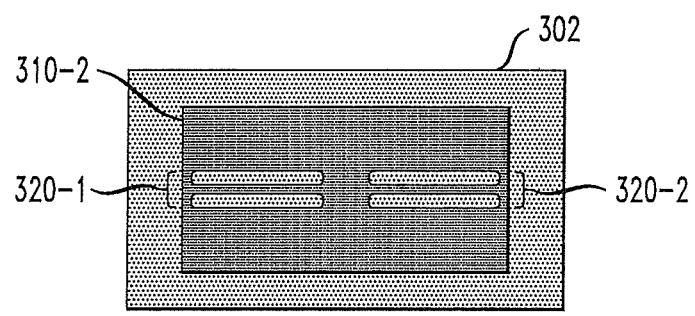
Figure 3C:
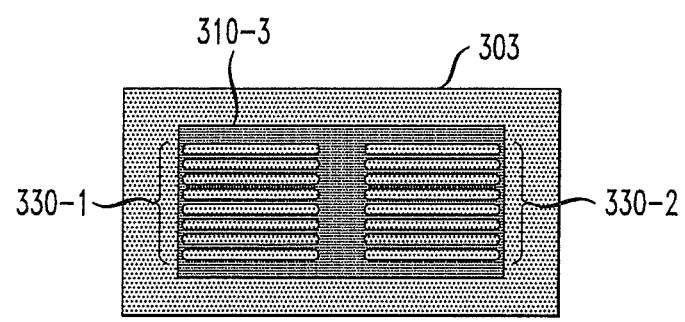
Figure 4:
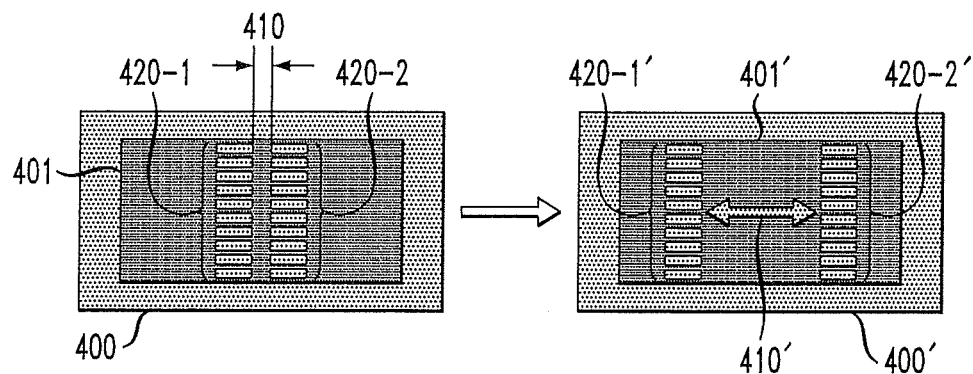
FIG. 4 illustrates graphene layers, according to an embodiment of the invention.

FIG. 3A illustrates an example arrangement of a portion of a FET 301. Source 311 and drain 312 are formed on a graphene layer 310-1. FIG. 3B shows a portion of a FET 302 where two sets of cuts 320-1 and 320-2 are formed in the graphene layer 310-2. Each set of cuts 320 in FET 302 consists of two cuts. FIG. 3C shows a FET 303 where two sets of cuts 330-1 and 330-2 are formed in the graphene layer 310-3. Each set of cuts 330 in FET 303 consists of eight cuts. While FIGS. 3B and 3C show parallel cuts formed in a graphene layer, other arrangements are possible. In addition, the sets of cuts 320 and 330 are shown where cuts are distinct from one another. For example, no two cuts in FIGS. 3B and 3C are so close to one another as to form substantially a single larger cut. FIG. 4 shows a FET 400 with two sets of cuts 420-1 and 420-2 on a graphene layer 401 separated by a distance 410. FIG. 4 also shows a FET 400' with two sets of cuts 420-1' and 420-2' on a graphene layer 401' separated by a distance 410'. Distances 410 and 410' illustrate a channel portion of a graphene layer of a FET. The channel region, as shown in FIG. 4, may be adjusted by adjusting distance 410/410' to tailor a FET to a specific application.

Figure 5:
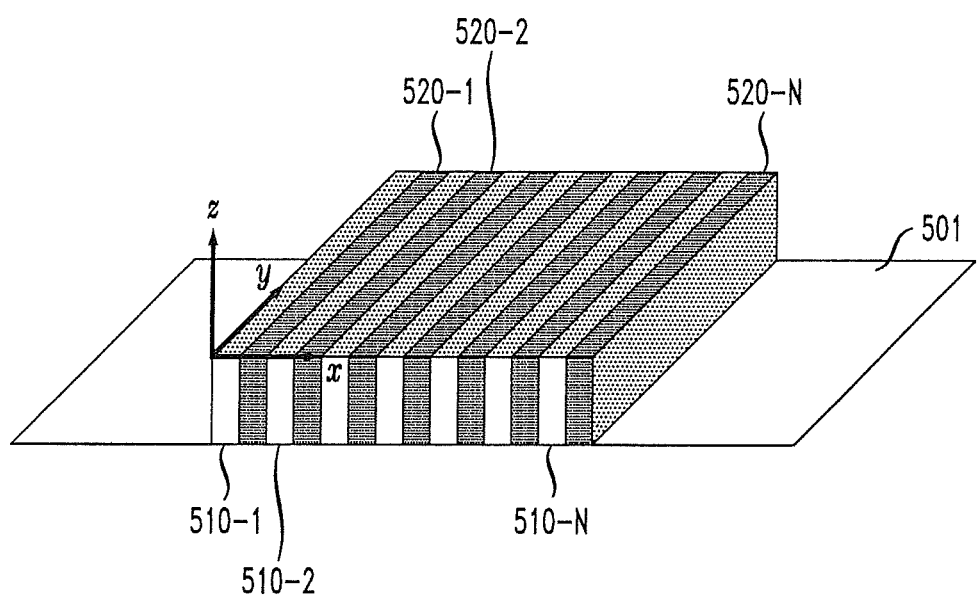
FIG. 5 illustrates a method of forming cuts, according to an embodiment of the invention.

FIG. 5 illustrates a method which may be used to form one or more cuts in a graphene layer 501. Narrow lamellae 510-1 to 510-N and 520-1 to 520-N are formed on the graphene layer 501. The narrow lamellae alternate between lamellae of type 510 and lamellae of type 520, which may be one of an appropriate block co-polymer (BCP) or polymer blend (PB) that creates self-assembled nanostructures of a controllable shape. A photolithographically fabricated template (e.g., parallel hydrogen silsesquioxan (HSQ) lines about 300 nm apart) is used to promote graphoepitaxy, and selective reactive ion etching (RIE) is used to remove one of the two kinds lamellae in the self-assembled BCP or PB as well as the graphene below that type of lamellae. Depending on the composition of the PB or relative block molecular weight in the BCP, the width of each kind of lamella is also controllable to a desired ratio. This method is simpler and cheaper than e-beam lithography to pattern cuts in graphene in a serial mode of operation.

Contact resistance represents a significant portion of the total resistance in a graphene FET. Forming cuts in graphene has been shown to reduce contact resistance in a graphene FET by at least one-third, depending on the specific metal or alloy used. As the number of cuts increases, reduction in contact resistance improves. However, at a certain point, the total number of cuts on a device with a given width may have a detrimental effect on total resistance. One reason for this is that as the number of cuts increases on a device with a given width, cuts may merge together due to inherent limitations in tools and techniques used to form the cuts. Another reason is that tools and techniques for forming cuts can leave residue on the graphene layer. This residue tends to concentrate on cut edges. As a result, embodiments of the invention utilize techniques to reduce the residue resulting from formation of the cuts. For example, the graphene layer may be cleaned subsequent to the cuts being formed. In addition, embodiments of the invention utilize annealing processes to further lower contact resistance.

As described above, a graphene layer may consist of a single sheet of graphene or multiple sheets of graphene. Graphene layers with only a few sheets of graphene may be referred to as few-layer graphene (FLG). Graphene layers with multiple graphene sheets may be referred to as multi-layer graphene (MLG). FLG devices have an advantage over single-sheet graphene layer devices in terms of noise reduction, especially when channels are trimmed into ribbons to open a bandgap. The interlayer resistance $R_{int}$ between graphene sheets is estimated to be ~105 ohms. For MLG devices, $R_{int}$ can add up to a substantial resistance. MLG devices may be desired for certain graphene-based interconnects. Embodiments of the present invention thus provide for cuts to be formed in each sheet of graphene in a MLG device. In other embodiments, cuts may be formed in a subset of a total set of sheets of graphene in a MLG device. As such, forming cuts in multiple sheets of graphene provides distinct advantages over other techniques, such as the $O_2$ plasma process described above.

Embodiments of the invention also allow for optimizing contact resistance while minimizing contact length. In general, contact length presents a major challenge for contact resistance as dimensions fall below the transfer length, $L_T$. For example, even small cuts 420/420' as shown in FIG. 4, which are close to a channel can maximize an edge-contacted graphene perimeter and thus improve contact resistance. In the example of FIG. 4, the channel is an area of the graphene layer with a distance 410/410' between source and drain regions formed on the graphene layer of a FET. For very small contacts, cuts may be formed with a gate stack of a FET already in place to achieve self-aligned cuts instead of relying on an alignment such as lithographic alignment. This approach may be preferred for contacts that are not scaled. In addition, embodiments of the invention may also provide for branched cuts, rather than the parallel cuts shown in FIGS. 1-3 in order to maximize a cut perimeter and lower the contact resistance to an optimal value.

Embodiments of the invention also provide advantages for parasitic capacitances. One example of a parasitic capacitance is a source-to-gate capacitance $C_{gs}$. FIG. 2 shows an example of a FET. A gate is a typical component of a FET which is not shown in FIG. 2 for clarity purposes. Embodiments of the invention allow for lowered contact resistance. In effect, this means that smaller contacts can be used to achieve the same contact resistance as for uncut contacts. The contact area, defined as the area of the graphene layer which is in contact with a metal such as a source or drain, can thus be smaller. Cut widths should remain as small as possible to avoid removing excessive amounts of graphene in the contact area. In other words, cut density should be high while cut width should be small. In some embodiments, cuts are formed to be as close as possible to an ideal of atomically small and precise cuts.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus comprising:
    at least one transistor comprising:
    a substrate;
    a graphene layer formed on the substrate; and
    first and second source/drain regions spaced apart relative to one another on the substrate;
    wherein the graphene layer comprises at least a first portion and a second portion, the first portion being in contact with the first source/drain region and the second portion being in contact with the second source/drain region; and
    wherein one or more cuts are formed in at least one of the first and second portions of the graphene layer.

2. The apparatus of claim 1, wherein the one or more cuts are formed parallel to one another.

3. The apparatus of claim 1, wherein the one or more cuts are formed perpendicular to a given one of the first and second source/drain regions.

4. The apparatus of claim 1, wherein the cuts formed in at least one of the first and second portions of the graphene layer amplify transmission of carriers from a given one of the first and second source/drain regions into the graphene layer.

5. The apparatus of claim 1, wherein the one or more cuts are formed in at least one of the contact regions using electron beam lithography.

6. The apparatus of claim 5, wherein the graphene layer is cleaned to remove at least a portion of residue formed on the graphene layer as a result of electron beam lithography.

7. The apparatus of claim 1, wherein at least one of the one or more cuts has a length at least equal to a transfer length of the contact between a given one of the first and second portions of the graphene layer and a given one of the first and second source/drain regions.

8. The apparatus of claim 1, wherein at least one of the one or more cuts has a length which exceeds a transfer length of the contact between a given one of the first and second portions of the graphene layer and a given one of the first and second source/drain regions.

9. The apparatus of claim 1, wherein the graphene layer comprises a third portion spaced between the first and second portions.

10. The apparatus of claim 9, wherein the one or more cuts formed in at least one of the first and second portions of the graphene layer do not extend into the third portion of the graphene layer.

11. The apparatus of claim 1, wherein the graphene layer is annealed subsequent to the one or more cuts being formed.

12. The apparatus of claim 1, wherein the graphene layer consists of one sheet of graphene.

13. The apparatus of claim 1, wherein the graphene layer comprises two or more sheets of graphene.

14. The apparatus of claim 13, wherein the one or more cuts are formed in each of the two or more graphene sheets of the graphene layer.

15. The apparatus of claim 1, wherein the one or more cuts are formed by forming alternating narrow lamellae of a first material and a second material on a surface of the graphene layer and removing the narrow lamellae of the first material and at least a portion of the graphene below the lamellae of the first material using a reactive ion etching process.

16. The apparatus of claim 15, wherein the first material is one of a block co-polymer and a polymer blend which create self-assembled nanostructures of a controllable shape.

17. The apparatus of claim 1, wherein the one or more cuts are formed by milling the graphene layer with a focused-ion beam.

18. The apparatus of claim 1, wherein the one or more cuts are formed using nanoimprint lithography.

19. The apparatus of claim 1, wherein the one or more cuts are formed apart relative to one another, such that two or more of the cuts do not merge to form a single cut.

20. The apparatus of claim 1, wherein the graphene layer is cleaned to remove at least a portion of residue formed on the graphene layer as a result of forming the one or more cuts.

21. An integrated circuit device comprising:
at least one transistor comprising:
a substrate;
a graphene layer formed on the substrate; and
first and second source/drain regions spaced apart relative to one another on the substrate;
wherein the graphene layer comprises at least a first portion and a second portion, the first portion being in contact with the first source/drain region and the second portion being in contact with the second source/drain region; and
wherein one or more cuts are formed in at least one of the first and second portions of the graphene layer.

* * * * *